US009571770B2

(12) United States Patent
Hayashi et al.

(10) Patent No.: US 9,571,770 B2
(45) Date of Patent: Feb. 14, 2017

(54) SENSE CIRCUIT AND METHOD OF OPERATION THEREOF AND PHOTOELECTRIC CONVERSION ARRAY CONNECTED TO INVERTING INPUT OF SENSE CIRCUIT

(71) Applicants: Yutaka Hayashi, Ibaraki (JP); Toshitaka Ota, Ibaraki (JP); Yasushi Nagamune, Ibaraki (JP); Hirofumi Watanabe, Hyogo (JP); Kazuhiro Yoneda, Osaka (JP); Katsuhiko Aisu, Hyogo (JP); Takaaki Negoro, Osaka (JP)

(72) Inventors: Yutaka Hayashi, Ibaraki (JP); Toshitaka Ota, Ibaraki (JP); Yasushi Nagamune, Ibaraki (JP); Hirofumi Watanabe, Hyogo (JP); Kazuhiro Yoneda, Osaka (JP); Katsuhiko Aisu, Hyogo (JP); Takaaki Negoro, Osaka (JP)

(73) Assignees: NATIONAL INSTITUTE OF ADVANCED INDUSTRIAL SCIENCE AND TECHNOLOGY, Tokyo (JP); RICOH COMPANY, LTD., Tokyo (JP)

( * ) Notice: Subject to any disclaimer, the term of this patent is extended or adjusted under 35 U.S.C. 154(b) by 492 days.

(21) Appl. No.: 13/745,197

(22) Filed: Jan. 18, 2013

(65) Prior Publication Data
US 2013/0187030 A1    Jul. 25, 2013

(30) Foreign Application Priority Data

Jan. 19, 2012    (JP) .................................. 2012-008686

(51) Int. Cl.
*H04N 5/378*    (2011.01)
*H01L 27/144*    (2006.01)

(52) U.S. Cl.
CPC ............ *H04N 5/378* (2013.01); *H01L 27/144* (2013.01)

(58) Field of Classification Search
CPC ............ H01L 27/144; H01L 27/14609; H01L 27/14612; H01L 27/14643; H04N 5/378; H04N 5/335; H04N 5/341; H04N 5/369; H04N 5/357; H04N 5/3575; H04N 5/363
(Continued)

(56) References Cited

U.S. PATENT DOCUMENTS 5,198,660 A    3/1993  Yokoyama et al.
5,416,345 A *  5/1995  Matsunaga .................... 257/222
(Continued)

FOREIGN PATENT DOCUMENTS

CN    1437388 A    8/2003
CN    1881597 A    12/2006
(Continued)

OTHER PUBLICATIONS

Mar. 23, 2015 Chinese official action in corresponding Chinese patent application No. 201310121289.8.
(Continued)

*Primary Examiner* — Que T Le
*Assistant Examiner* — Jennifer Bennett
(74) *Attorney, Agent, or Firm* — Cooper & Dunham LLP

(57) ABSTRACT

A sense circuit includes a differential amplifier circuit including an inverting input section, a non-inverting input section and an output section, an electrical capacitor connected between the inverting input section and the output section, and a field effect transistor including a source, a drain, and a gate. One of the source and the drain is
(Continued)

connected to the inverting input section, and the other of the source and the drain is connected to the output section. A reference potential is supplied to the non-inverting input section, and an output section of a photoelectric conversion cell having an added switching function is connected to the inverting input section.

21 Claims, 12 Drawing Sheets

(58) Field of Classification Search
USPC ...... 250/214 R, 208.1, 214 A; 348/308, 302, 348/241, 294, 303, 304, 311; 257/290, 257/291, 292, 294, 257, 258
See application file for complete search history.

(56) References Cited

U.S. PATENT DOCUMENTS

| | | | |
|---|---|---|---|
| 5,717,458 A * | 2/1998 | Yonemoto | ............ 348/305 |
| 5,751,005 A | 5/1998 | Wyles et al. | |
| 6,201,248 B1 * | 3/2001 | Marion | ............ H01L 27/14603 |
| | | | 250/370.08 |
| 6,747,264 B2 * | 6/2004 | Miida | ............ 250/214 AG |
| 7,619,197 B2 * | 11/2009 | Tredwell | ............ H04N 3/1568 |
| | | | 250/208.1 |
| 7,679,223 B2 * | 3/2010 | Agarwal et al. | ............ 307/117 |
| 2005/0134715 A1 * | 6/2005 | Fowler | ............ H04N 3/1568 |
| | | | 348/308 |
| 2009/0140155 A1 * | 6/2009 | Yagi et al. | ............ 250/370.09 |
| 2010/0002114 A1 | 1/2010 | Ogura et al. | |

FOREIGN PATENT DOCUMENTS

| | | |
|---|---|---|
| JP | 5-37250 | 2/1993 |
| JP | 8-152478 | 6/1996 |
| JP | 2000-346950 | 12/2000 |
| JP | 3146502 | 1/2001 |
| JP | 2005-114543 | 4/2005 |
| JP | 2008-172336 | 7/2008 |
| JP | 4286101 | 4/2009 |
| JP | 2010-217661 | 9/2010 |
| JP | 2011-149901 | 8/2011 |

OTHER PUBLICATIONS

Japanese official action dated Oct. 6, 2015 in corresponding Japanese Patent Application No. 2012-008686.

* cited by examiner

SENSE CIRCUIT AND METHOD OF OPERATION THEREOF AND PHOTOELECTRIC CONVERSION ARRAY CONNECTED TO INVERTING INPUT OF SENSE CIRCUIT

CROSS-REFERENCE TO RELATED APPLICATION

This application is based on and claims the priority benefit of Japanese Patent Application No. 2012-008686, filed on Jan. 19, 2012, the disclosure of which is incorporated herein by reference in its entirety.

BACKGROUND OF THE INVENTION

Field of the Invention

The present invention relates to a sense circuit for use in a photoelectric conversion device or an image sensing device or the like for converting optical information such as light intensity or light wavelength or an optical image into electric current, electric charge or voltage, or electronic information containing digital data, and a method of operation of the sense circuit, and a photoelectric conversion array using the sense circuit.

Description of the Related Art

In the case of a photoelectric conversion cell in which an electronic information output is a voltage output, such as a CMOS (complementary metal oxide semiconductor) sensor, a voltage amplifier circuit has heretofore been used as a sense circuit. In this case, charging or discharging voltage on an output line connected to the output of the cell is high- and the connection of many cells to the output line leads to the connection of stray capacitances of high value in total to the output line and thus in turn a read speed is degraded, and further, very small voltage signals are buried in noise voltage which is superimposed on the output line, resulting in an impediment to enhancement of sensitivity.

Meanwhile, in cases where electronic information is obtained from a photoelectric conversion element which provides a current output, such as a photodiode, the sense circuit may possibly be devised to achieve high-speed operation; however, the same problems as above described are encountered in a sense circuit in which a resistance element is used to convert the current output into voltage.

Further, heretofore, it has been necessary for AD (analog-digital) conversion or the like that an output of the sense circuit be provided with a circuit to sample and hold a peak voltage or an average voltage, because, when output electronic information is subjected only to time-continuous processing which is continuous in time, an output voltage signal from the sense circuit varies greatly with time.

Meanwhile, techniques which involve integrating an output photocurrent from the photodiode and performing signal processing on an output voltage are disclosed in Japanese Patent Nos. 3146502 and 4286101. Problems inherent in the techniques are that an additional circuit to avoid switching noise is necessary because the output voltage is subjected to the signal processing while the photocurrent from the photodiode is passing through an integrating circuit, and that these techniques are unable to be used for processing signals from arrayed photoelectric conversion cells, because the photodiode is connected to the integrating circuit at all times. When a switching function for turning on or off an output current or the like is added to the photoelectric conversion element such as the photodiode in order to avoid the problems, switching control pulse noise is superimposed on the output, thus rendering it difficult to take out electronic information corresponding to feeble light.

SUMMARY OF THE INVENTION

1. The photoelectric conversion element or photoelectric conversion cell having an on-off switch function added thereto as described above (herein, photoelectric conversion sections capable of being connected in an array are called the photoelectric conversion cells) is deteriorated in detection sensitivity by feed-through noise of a switching pulse. One of the objects of the present invention is to solve this problem. Further, other objects of the present invention are given below.

2. If the photoelectric conversion cell provides a current output, an object of the present invention is to speed up reading, through reducing the time required to read each photoelectric conversion cell by reducing the amount of change in potential of the output line.

3. Another object of the present invention is to suppress a loss of an output signal for reading, by reducing the proportion of output current used to charge or discharge the output line, even if the connection of many cells to the output line causes an increase in stray capacitances of the output line.

4. A sense circuit to amplify the output from the photoelectric conversion cell with time sequence needs to be improved in its sensing speed. Instead, an array of sense circuits provided for each output line is used for high sensing speed, but the sense circuits are required to suppress variations in amplification factor, and therefore, the circuit becomes complicated and occupies a large area on a semiconductor chip, which in turn renders it difficult to array a large number of sense circuits (for example, more than 1000 sense circuits). Still another object of the present invention is, therefore, to achieve both a reduction in variations in output voltage from the sense circuit relative to the same output from the photoelectric conversion cell and a simplification of configuration.

5. A further object of the present invention is to enable an arrayed layout of sense circuits each capable of having a direct connection to an AD converter circuit, for each output line. The configuration that the output from each output line is converted to a digital signal reduces susceptibility to noise caused by the scanning of the output when the output from each output line is scanned to produce a serial output signal of a photoelectric conversion array.

In order to attain the above objects, the present invention provides techniques given below.

Firstly, a photoelectric conversion cell, for use in the present invention, having an added switching function for on-off control of an electronic information output from a photoelectric conversion element has any one of configurations given below.

1) A photoelectric conversion element is connected to a first base of a first bipolar transistor, and a first emitter or a first collector of the first bipolar transistor serves as the control section to turn on or off an electronic information output from the photoelectric conversion cell. The first emitter or the first collector of the first bipolar transistor serves as the output section of the photoelectric conversion cell. The first base, the first collector and a first base-first collector junction of the first bipolar transistor may also be used as the photoelectric conversion element (or a phototransistor). Herein, the photoelectric conversion element refers to a photoresistor (or a photoconductor) which changes in resistance value by light input, a photodiode which changes in current or voltage by light input, a photo-capacitor (or a photo-condenser) which changes in electrical capacitance value (or capacitance) by light input, or the like.

Further, the photoelectric conversion cell may have the following configuration. Specifically, the first emitter of the first bipolar transistor is connected to a second base of a second bipolar transistor, any one of a second emitter, a second collector and the first collector serves as the control section, and one of the others serves as the output section. In addition to this configuration, the photoelectric conversion cell may have the following configuration. Specifically, the second emitter is connected to a third base of a third bipolar transistor, any one of a third emitter, a third collector, the first collector and the second collector serves as the control section, and one of the others serves as the output section.

2) The photoelectric conversion cell has a configuration in which one of a drain and a source of a switching field effect transistor is connected to one end of a photoelectric conversion element. The other of the drain and the source of the switching field effect transistor serves as the output section of the photoelectric conversion cell. A gate of the switching field effect transistor serves as the control section to turn on or off an electronic information output from the photoelectric conversion cell. Further, in the photoelectric conversion cell described in "A", one of the drain and the source of the switching field effect transistor is connected to one end of the photoelectric conversion element, the other of the drain and the source of the switching field effect transistor serves as the output section of the photoelectric conversion cell, and the gate of the switching field effect transistor serves as the control section to turn on or off an electronic information output from the photoelectric conversion cell.

In order to attain the above objects, there is provided a method of operation given below.

(1) A method of operation of a sense circuit, the sense circuit including;

a differential amplifier circuit including an inverting input section, a non-inverting input section, and an output section;

an electrical capacitor (also referred to as an electric condenser; the same applies hereinbelow) connected between the inverting input section and the output section; and a first field effect transistor including a first source, a first drain, and a first gate, in which one of the first source and the first drain is connected to the inverting input section, and the other of the first source and the first drain is connected to the output section, in which a reference potential is supplied to the non-inverting input section, an output section of a photoelectric conversion cell to output an electric current or electric charge is connected to the inverting input section, but, when the output section of the photoelectric conversion cell is connected to an output line of a photoelectric conversion array, the output line is connected to the inverting input section, the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs electronic information as the electric current or electric charge, before the output control potential of the photoelectric conversion cell turns into the on-state potential, a potential to make the first field effect transistor off is supplied to the first gate, the output control potential of the photoelectric conversion cell is changed into the on-state potential, and thereby, during a first time period, the output section of the photoelectric conversion cell supplies the electric current or electric charge to the inverting input section, during a second time period, the output control potential of the photoelectric conversion cell is held at the off-state potential thereby to hold a potential (or voltage) of the output section of the differential amplifier circuit, and thereafter, during a third time period, a potential to bring the first field effect transistor into conduction is supplied to the first gate, and after that, the potential to make the first field effect transistor off is supplied to the first gate.

(2) The method of operation of the sense circuit, according to (1) in which after the output control potential of the same photoelectric conversion cell has been changed into the on-state potential within the third time period, the output control potential is changed into the off-state potential.

(3) The method of operation of the sense circuit, according to (1), in which the sense circuit according to (1) further comprises a second field effect transistor including a second source, a second drain, and a second gate, the one of the first source and the first drain of the first field effect transistor is disconnected from the inverting input section and is connected to one of the second source and the second drain of the second field effect transistor, the other of the second source and the second drain is connected to the inverting input section, and a potential to bring the second field effect transistor into conduction is supplied to the second gate of the second field effect transistor.

In order to attain the above objects, there is provided a configuration of a sense circuit given below, the operation of which is defined.

(4) A sense circuit including:

a differential amplifier circuit including an inverting input section, a non-inverting input section, and an output section;

an electrical capacitor connected between the inverting input section and the output section; and a first field effect transistor including a first source, a first drain, and a first gate, in which one of the first source and the first drain is connected to the inverting input section, and the other of the first source and the first drain is connected to the output section, a reference potential is supplied to the non-inverting input section, an output section of a photoelectric conversion cell to output an electric current or electric charge is connected to the inverting input section, but, when the output section of the photoelectric conversion cell is connected to an output line of a photoelectric conversion array, the output line is connected to the inverting input section, the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs the electric current or electric charge, before the output control potential of the photoelectric conversion cell turns into the on-state potential, a potential to make the first field effect transistor off is supplied to the first gate, the output control potential of the photoelectric conversion cell is changed into the on-state potential, and thereby, during a first time period, the output section of the photoelectric conversion cell supplies the electric current or electric charge to the inverting input section, the output control potential of the photoelectric conversion cell is held at the off-state potential during a second time period thereby to hold a potential (or voltage) of the output section of the differential amplifier circuit for a required time, and thereafter, during a third time period, a potential to bring the first field effect transistor into conduction is supplied to the first gate, and after that, the potential to make the first field effect transistor off is supplied to the first gate.

(5) The sense circuit according to (4), in which after the output control potential of the same photoelectric conversion cell has been changed into the on-state potential within the third time period, the output control potential is changed into the off-state potential.

(6) The sense circuit according to (4), further including a second field effect transistor including a second source, a second drain, and a second gate, in which the one of the first source and the first drain of the first field effect transistor is disconnected from the inverting input section and is connected to one of the second source and the second drain of the second field effect transistor, the other of the second source and the second drain is connected to the inverting input section, and a potential to bring the second field effect transistor into conduction is supplied to the second gate of the second field effect transistor.

(7) A sense circuit including:

a differential amplifier circuit including an inverting input section, a non-inverting input section, and an output section;

an electrical capacitor connected between the inverting input section and the output section; and a resistive element connected to the inverting input section and the non-inverting input section, in which a product of a capacitance value of the electrical capacitor and a resistance value of the resistive element is not less than a value of a first time period nor more than a value of a second time period, a reference potential is supplied to the non-inverting input section, an output section of a photoelectric conversion cell to output an electric current or electric charge is connected to the inverting input section, but, when the output section of the photoelectric conversion cell is connected to an output line of a photoelectric conversion array, the output line is connected to the inverting input section, the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs the electric current or electric charge, and the output control potential of the photoelectric conversion cell is changed into the on-state potential and, thereby, during the first time period, the output section of the photoelectric conversion cell supplies the electric current or electric charge to the inverting input section, and the output control potential of the photoelectric conversion cell is changed into the off-state potential and is held at the off-state potential during the second time period, whereby electronic information is read from the output section of the differential amplifier circuit.

(8) A photoelectric conversion array including:

a plurality of photoelectric conversion cells each including an output section and a control section;

a plurality of output lines extending in a first direction; and a plurality of sense circuits according to any one of (4) and (7), in which one or more of the plurality of photoelectric conversion cells arranged in the first direction is connected at the output section to one of the plurality of output lines, and one of the plurality of sense circuits according to any one of (4) and (7) is connected at the inverting input section to the one of the plurality of output line.

(9) The photoelectric conversion array according to (8), further including:

a plurality of selection lines extending in a second direction intersecting the first direction; and a selection line driver circuit to drive the selection lines, in which one or more of the plurality of photoelectric conversion cells arranged in the second direction is connected at an output control section to one of the plurality of selection lines, and the selection line driver circuit sequentially supplies the off-state potential of the output control potential of the photoelectric conversion cell, the on-state potential thereof, and, further, the off-state potential thereof, to the plurality of selection lines.

(10) The photoelectric conversion array according to (9), further including:

a plurality of AD (analog-to-digital) converter circuits each including an input section connected to a corresponding one of the output sections of the plurality of sense circuits, in which during a time period while the selection line driver circuit is supplying the off-state potential to the selection lines, the output potential of the plurality of sense circuits is captured and subjected to AD conversion.

(11) The photoelectric conversion array according to (9), further including:

a plurality of scan circuits each including an input section connected to a corresponding one of the output sections of the plurality of sense circuits, in which during the time period while the selection line driver circuit is supplying the off-state potential to the selection lines, the output potential of the plurality of sense circuits is captured and scanned.

(12) The photoelectric conversion array according to (10), in which the plurality of AD converter circuits each further include an output section to output a digital signal obtained by the AD conversion, and a plurality of scan circuits each including an input section connected to a corresponding one of the output sections of the plurality of AD converter circuits are provided to capture and scan the digital outputs from the plurality of AD converter circuits during the time period while the selection line driver circuit is supplying the off-state potential to the selection lines.

(13) The photoelectric conversion array according to (8), in which the plurality of photoelectric conversion cells each including the output section and the control section are each configured so that one end of a photoelectric conversion element is connected to a first base of a first bipolar transistor, one of a first collector and a first emitter of the first bipolar transistor serves as the control section, the other serves as the output section, and either a potential supply means or the first collector is connected to the other end of the photoelectric conversion element, and the photoelectric conversion element is any one of a photoresistor which changes in resistance by light irradiation, a photodiode which changes in voltage or current by light irradiation, and a photocapacitor which changes in capacitance value by light irradiation.

(14) The photoelectric conversion array according to (13), in which the photoelectric conversion cell is configured so that the photoelectric conversion element is formed of the first base, the first collector and a first base-collector junction of the first bipolar transistor (or a phototransistor).

(15) The photoelectric conversion array according to (13), in which the photoelectric conversion cell is further provided with a second bipolar transistor including a second collector, a second base and a second emitter, the first emitter is connected to the second base, any one of the second emitter, the second collector and the first collector serves as the control section, and one of the others serves as the output section.

(16) The photoelectric conversion array according to (14), in which the photoelectric conversion cell is further provided with a second bipolar transistor including a second collector, a second base and a second emitter, the first emitter is connected to the second base, any one of the second emitter, the second collector and the first collector serves as the control section, and one of the others serves as the output section.

(17) The photoelectric conversion array according to (15), in which the photoelectric conversion cell is further provided with a third bipolar transistor including a third collector, a third base and a third emitter, the second emitter is connected to the third base, any one of the third emitter, the third collector, the first collector and the second collector serves as the control section, and one of the others serves as the output section.

(18) The photoelectric conversion array according to (16), in which the photoelectric conversion cell is further provided with a third bipolar transistor including a third collector, a third base and a third emitter, the second emitter is connected to the third base, any one of the third emitter, the third collector, the first collector and the second collector serves as the control section, and one of the others serves as the output section.

(19) The photoelectric conversion array according to (8), in which the plurality of photoelectric conversion cells each including the output section and the control section are each configured so that one end of a photoelectric conversion element is connected to one of a third drain and a third source of a third field effect transistor (or the above-described switching field effect transistor), a third gate of the third field effect transistor serves as the control section, the other of the third drain and the third source serves as the output section, and a specified potential is connected to the other end of the photoelectric conversion element, and the photoelectric conversion element is any one of a photoresistor which changes in resistance by light irradiation, a photodiode which changes in voltage or current by light irradiation, and a photocapacitor which changes in capacitance value by light irradiation.

(20) The photoelectric conversion array according to any one of (13) and (14), in which the photoelectric conversion cell is configured so that the first emitter in the photoelectric conversion cell is connected to one of a third drain and a third source of a third field effect transistor, a third gate of the third field effect transistor serves as the control section, the other of the third drain and the third source serves as the output section, and a specified potential is connected to the first collector.

(21) The photoelectric conversion array according to any one of (15) and (16), in which the photoelectric conversion cell is configured so that the second emitter in the photoelectric conversion cell is connected to one of a third drain and a third source of a third field effect transistor, a third gate of the third field effect transistor serves as the control section, the other of the third drain and the third source serves as the output section, and a specified potential is connected to either the first collector or the second collector.

(22) The photoelectric conversion array according to any one of (17) and (18), in which the photoelectric conversion cell is configured so that the third emitter in the photoelectric conversion cell is connected to one of a third drain and a third source of a third field effect transistor, a third gate of the third field effect transistor serves as the control section, the other of the third drain and the third source serves as the output section, and a specified potential is connected to either the first collector, the second collector or the third collector.

BRIEF DESCRIPTION OF THE DRAWINGS

FIG. 2-1 is a circuit diagram illustrating another embodiment of the sense circuit of the present invention.

FIG. 2-2 is a circuit diagram illustrating still another embodiment of the sense circuit of the present invention.

FIG. 7-1 is a circuit diagram illustrating First Example of a photoelectric conversion cell having an added switching function for on-off control of an electronic information output, using a bipolar transistor.

FIG. 7-2 is a circuit diagram illustrating another Example of a photoelectric conversion cell having an added switching function for on-off control of an electronic information output, using a bipolar transistor.

FIG. 8-1 is a circuit diagram illustrating still another Example of a photoelectric conversion cell having an added switching function for on-off control of an electronic information output, using a bipolar transistor.

FIG. 8-2 is a circuit diagram illustrating a further Example of a photoelectric conversion cell having an added switching function for on-off control of an electronic information output, using a bipolar transistor.

FIG. 9-1 is a circuit diagram illustrating a further Example of a photoelectric conversion cell having an added switching function for on-off control of an electronic information output, using a bipolar transistor.

FIG. 9-2 is a circuit diagram illustrating a further Example of a photoelectric conversion cell having an added switching function for on-off control of an electronic information output, using a bipolar transistor.

FIG. 11-1 is a circuit diagram illustrating another Example of a photoelectric conversion cell having an added switching function for on-off control of an electronic information output, using a field effect transistor.

FIG. 11-2 is a circuit diagram illustrating still another Example of a photoelectric conversion cell having an added switching function for on-off control of an electronic information output, using a field effect transistor.

DETAILED DESCRIPTION OF THE PREFERRED EMBODIMENTS

Figure 1:
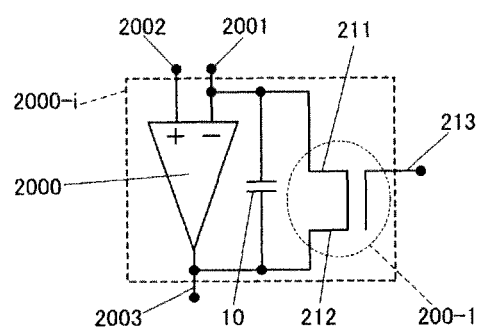
FIG. 1 is a circuit diagram illustrating a first embodiment of a sense circuit of the present invention.

FIG. 1 is a circuit diagram illustrating a first embodiment of a sense circuit 2000-$i$ of the present invention. A differential amplifier circuit 2000 includes an inverting input section 2001, a non-inverting input section 2002, and an output section 2003, and an electrical capacitor 10 is connected between the inverting input section 2001 and the output section 2003. Also, the inverting input section 2001 is connected to one 211 of a first source and a first drain of a first field effect transistor 200-1, and the output section 2003 is connected to the other 212 of the first source and the first drain of the first field effect transistor 200-1.

The non-inverting input section 2002 is supplied with a reference potential. The inverting input section 2001 has a connection to an output section of a photoelectric conversion cell to output an electric current or electric charge. The photoelectric conversion cell includes a control section besides the output section; when an output control potential supplied to the control section of the photoelectric conversion cell is an off-state potential, the output section of the photoelectric conversion cell does not output significant electronic information (although it produces an output on the order of magnitude of leakage current), while, when the output control potential changes into an on-state potential, the output section outputs an electric current or electric charge. Examples of the photoelectric conversion cell will be described later.

Figure 6:
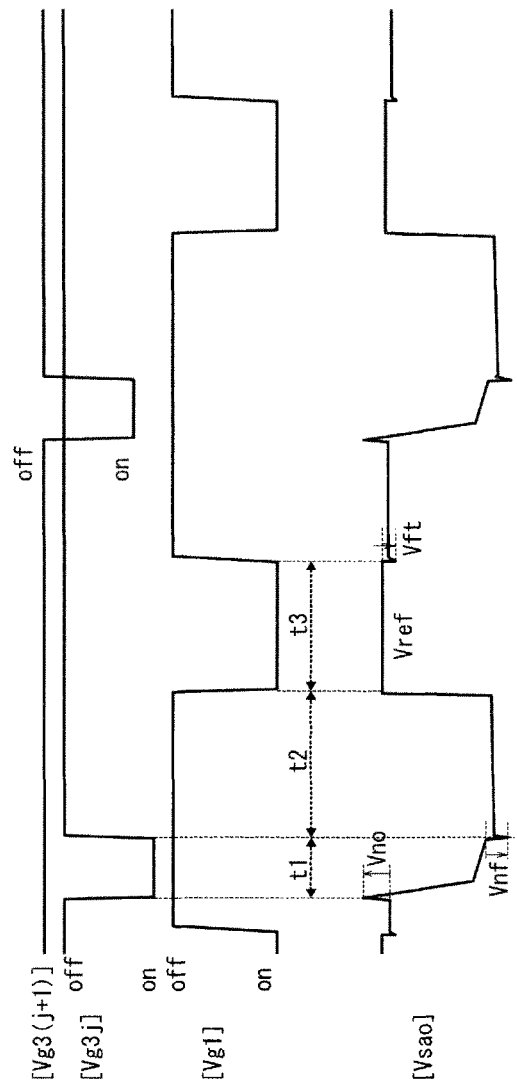
FIG. 6 is an operational waveform chart for explaining circuit operation of a further embodiment of the photoelectric conversion array according to the present invention.

FIG. 6 is a voltage waveform chart for explaining circuit operation of the first embodiment. Voltage waveforms indicated by [Vg3$j$] and [Vg3($j$+1)] in FIG. 6 represent changes in the output control potential of two adjacent photoelectric conversion cells, and description will be given using as an example a condition where the off-state potential of the output control potential of the photoelectric conversion cells is in a high state and the on-state potential of the output control potential of the photoelectric conversion cells is in a low state; however, their polarity may be the reverse of the above.

When a potential [Vg1] of a gate 213 is a potential (here, in the low state) which brings the field effect transistor 200-1 into conduction, the non-inverting input section 2002 and the output section (or terminal) 2003 become conducting, and as a result, the output section 2003 outputs the reference potential.

Then, even when the potential [Vg1] of the gate 213 changes from the above state into a potential (here, in the high state) which makes the field effect transistor 200-1 off, nothing changes if there is no electric input from the inverting input section. At this point in time, therefore, there is no change in an output from the differential amplifier circuit. Subsequently, the output control potential [Vg3$j$] is changed from the off-state potential to the on-state potential to enable an output from the photoelectric conversion cell, and thereby, during a time period (or a first time period) indicated by t1 in FIG. 6, an electric charge or electric current from the photoelectric conversion cell is stored in the electrical capacitor and is converted into a voltage, which, in turn, can be obtained as the output from the differential amplifier circuit.

After that, the output control potential is changed from the on-state potential to the off-state potential to disable the output from the photoelectric conversion cell. From this point in time, the output potential from the differential amplifier circuit is held for a time period (or a second time period) indicated by t2 in FIG. 6. The output potential can be used as analog electronic information from the photoelectric conversion cell. Furthermore, after this, digital electronic information from the photoelectric conversion cell can be obtained by inputting the output potential from the differential amplifier circuit to an input section of the AD converter provided additionally to convert the analog value to a digital value. Thereby, almost all electric charges or electric currents outputted during the turning on and off of the photoelectric conversion cell are stored in the electrical capacitor and converted into voltage so that the output potential can be obtained as analog electronic information or optionally as digital electronic information. This is an amount in correlation with the amount of electric charge stored in the photoelectric conversion cell by photoelectric conversion while the photoelectric conversion cell is in the off state, and photocurrent produced in the photoelectric conversion cell while the photoelectric conversion cell is in the on state. In some case, the electric charge stored in the photoelectric conversion cell by the photoelectric conversion or the photocurrent produced therein is amplified and outputted from the photoelectric conversion cell, depending on the configuration of the photoelectric conversion cell.

After the output potential from the differential amplifier circuit has been held during the time period t2, a conduction potential is applied to the first gate of the first field effect transistor during a time period for a third time period) indicated by t3 in FIG. 6, and thereby, the output section and the inverting input section of the differential amplifier circuit become conducting, so that the inverting input section and the output line are set to a reference potential Vref as the potential of the non-inverting input section. At this time, the on-state potential is supplied to the control section of the photoelectric conversion cell which until now has been read, and thereby, when residual stored charge which has been incompletely read remains in the photoelectric conversion cell, the stored charge can be drawn since the output line is connected to the output of the differential amplifier circuit with low impedance. After the time period t3, a cutoff potential is applied to the first gate of the first field effect transistor and then the circuit is ready for reading the next photoelectric conversion cell. After this, the on-state potential is supplied to the control section of the next photoelectric conversion cell as indicated by the output control potential [Vg3(j+1)] in FIG. 6, and then the reading of the next photoelectric conversion cell starts.

Figures 1, 2:
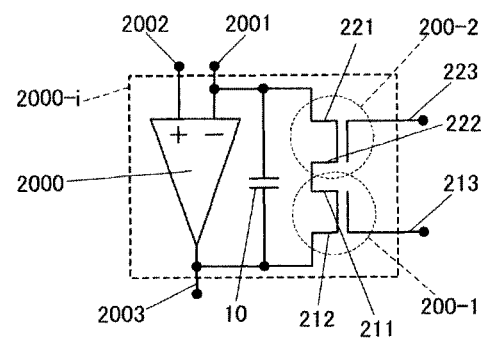
Figure 2:
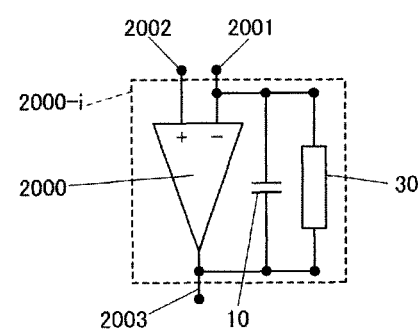

Here, when the cutoff potential is applied to the first gate of the first field effect transistor, a feed-through current flows into the output line through a gate-source or gate-drain parasitic capacitance of the first field effect transistor. At this time, the output line is in a floating state, thus resulting in the potential of the output line being changed from the reference potential (refer to Vft in FIG. 6). In order to reduce the amount of potential change Vft in the output line caused by the feed-through current, a second field effect transistor 200-2 is interposed between the first field effect transistor 200-1 and the inverting input section 2001 as illustrated in FIG. 2-1. The one 211 of the first source and the first drain of the first field effect transistor is disconnected from the inverting input section 2001 and is connected to one 222 of a second source and a second drain of the second field effect transistor 200-2, and the other 221 of the second source and the second drain is connected to the inverting input section. A conduction potential to bring the second field effect transistor into conduction is supplied to a second gate 223 of the second field effect transistor.

Even when a cutoff potential change is given to the first gate of the first field effect transistor, the conduction potential is applied to the second gate, and thereby, most of the feed-through current from the first gate is diverted through a channel and second gate of the second field effect transistor. Thus, the amount of potential change in the output line is reduced.

FIG. 2-2 illustrates a sense circuit excluding switching operation of the field effect transistor as a cause of the feed-through current. A resistive element 30 rather than the field effect transistor is connected to the output section 2003 and the inverting input section 2001 of the differential amplifier circuit 2000. Although an equivalent resistance value Rp of the resistive element requires that a time constant CRp with respect to a capacitance value C(10) of the electrical capacitor connected in parallel with the resistive element be larger than the time period t1, the time constant CRp needs to be smaller than the time period t3 because it is necessary that the output decays during the time period t3. This is useful when the time period t3 has a large value and hence an interval between readings is long. However, the time period t3 may be set to a small value, when the photoelectric conversion cell has the function of resetting itself or when the output line has the function of resetting its potential to the reference potential Vref.

Figure 3:
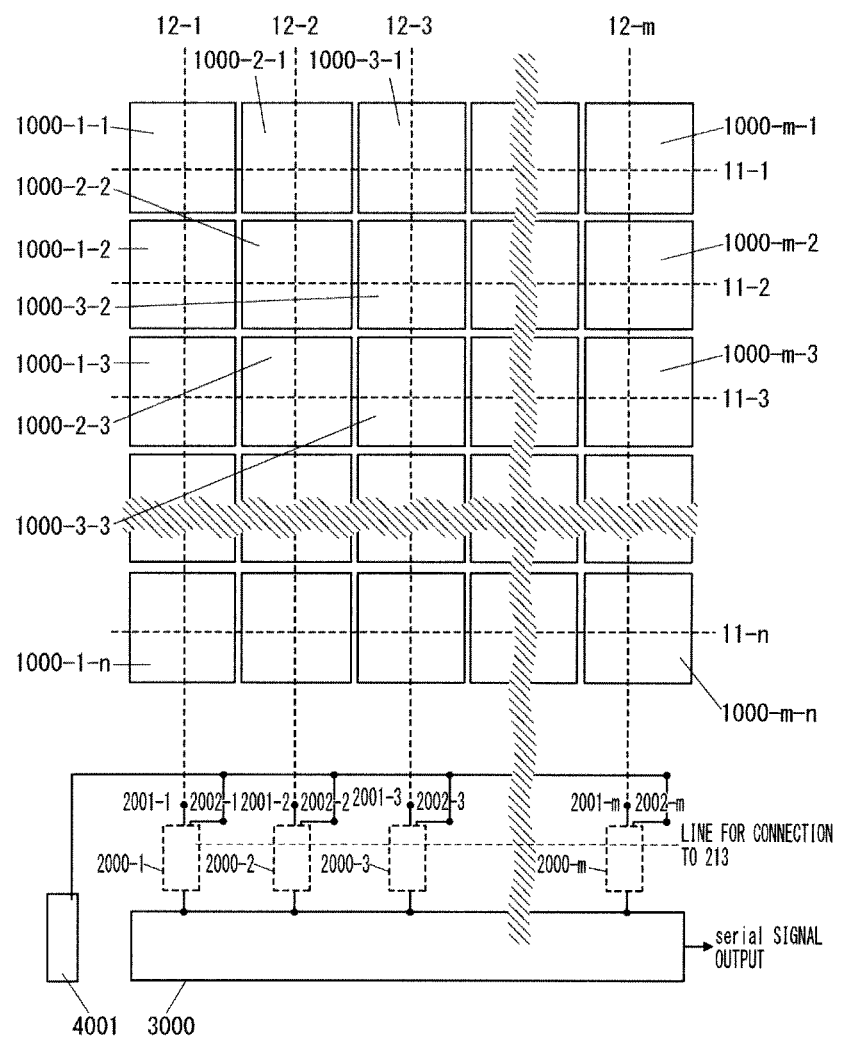
FIG. 3 is a circuit block diagram illustrating a first embodiment of a photoelectric conversion array according to the present invention.

FIG. 3 is a circuit block diagram illustrating a photoelectric conversion array according to the present invention. The photoelectric conversion array includes plural photoelectric conversion cells 1000-$i$-$j$ (where i is between 1 and m, and j is between 1 and n) arranged in a matrix along a first direction and a second direction intersecting each other, plural selection lines 11-$j$ (where j is between 1 and n) and plural output lines 12-$i$ (where i is between 1 and m) to drive the matrix, plural sense circuits 2000-$i$ each with a reference input (where i is between 1 and m), connected to the output lines, respectively, a scan circuit 3000 configured to read output signals from the sense circuits on the time series and output serial image signals, and a reference potential supply means 4001 for supplying the reference potential to each of the sense circuits each with the reference input.

Each of the sense circuits 2000-$i$ (where i is between 1 and m) includes any one of the sense circuits illustrated in FIG. 1 and FIGS. 2-1 and 2-2, and performs processing by using the previously described method which involves storing an output charge or current from a photoelectric conversion cell, selected and enabled for each reading, in the electrical capacitor; converting the charge or current into a voltage; pet-forming the reading; and thereafter, resetting the output voltage; storing an output charge or current from the next photoelectric conversion cell in the electrical capacitor; and converting the charge or current into a voltage. This makes it possible to obtain electronic information with light intensity according to the positions of the plural photoelectric conversion cells arranged.

Incidentally, in a configuration illustrated in FIG. 3, a corresponding number of sense circuits to the number of columns are provided, and each sense circuit is configured to process an equal number of outputs from photoelectric conversion cells to the number of rows; however, the numbers of photoelectric conversion cells and sense circuits, or combinations thereof may be set to any number or combination, and the photoelectric conversion cells and the sense circuits may be used in combination according to purposes or applications.

Figure 4:
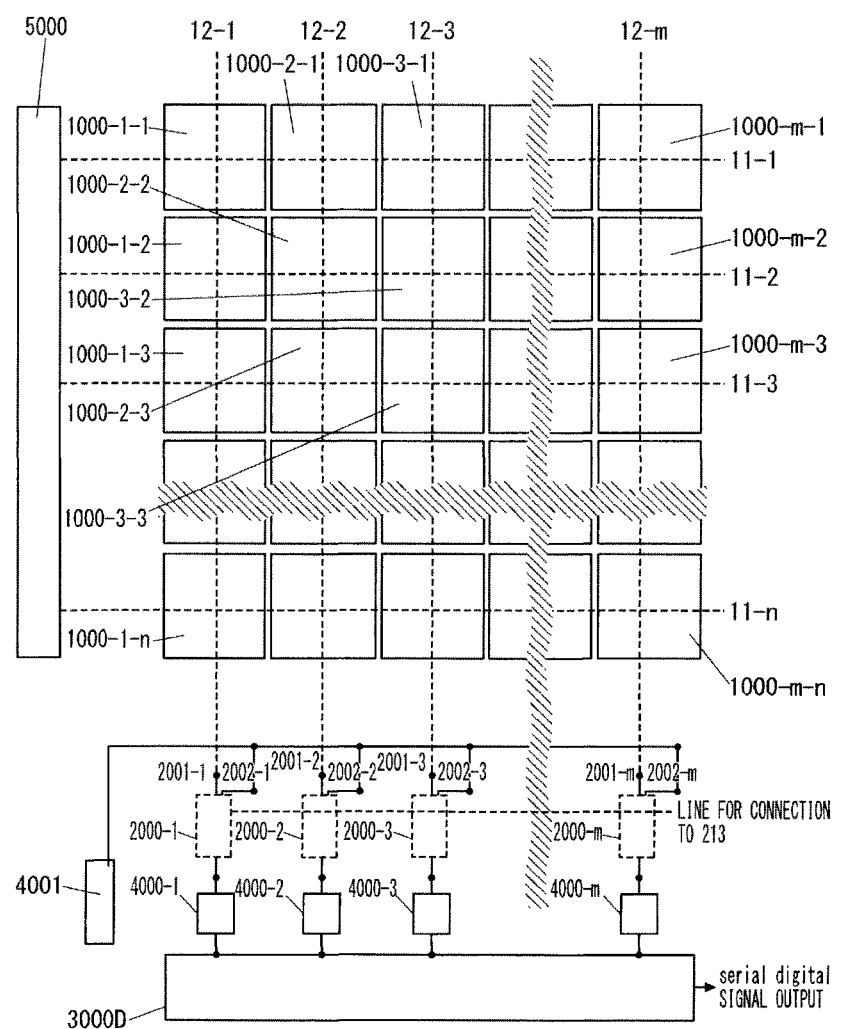
FIG. 4 is a circuit block diagram illustrating another embodiment of the photoelectric conversion array according to the present invention.

FIG. 4 illustrates a configuration in which the photoelectric conversion array illustrated in FIG. 3 is further provided with a selection line driver circuit 5000 to drive the selection lines connected to the control section s of the photoelectric conversion cells in the second direction, and plural AD converter circuits 4000-$i$ (where i is between 1 and m) connected at their inputs to the output sections of the plural sense circuits 2000-$i$ (where i is between 1 and m). The selection line driver circuit is feasible with a known shift register. The selection lines 11-$j$ (where j is between 1 and n) are scanned by being sequentially supplied with the off-state potential, the on-state potential and the off-state potential from the selection line driver circuit 5000. During the time period indicated by t2 in FIG. 6, the AD converter circuits 4000-$i$ perform AD conversion on the outputs from the sense circuits 2000-$i$ thereby to output digital information, and a scan circuit 3000D reads the digital information on the time series and outputs serial digital information.

Figure 5:
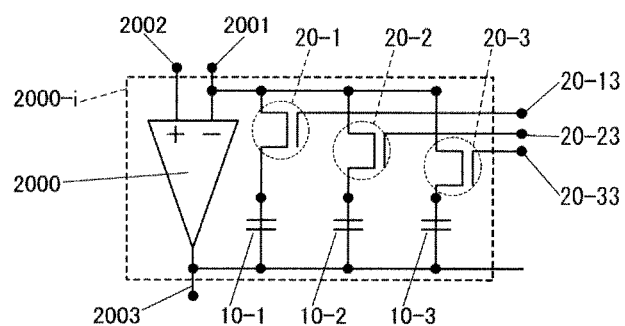
FIG. 5 is a circuit diagram illustrating a further embodiment of the sense circuit of the present invention.

FIG. 5 illustrates Modification of the sense circuit, in which, in order that a stored charge-voltage conversion factor is made variable, sources or drains of field effect transistors 20-1, 20-2, 20-3 are connected at their respective ends in series with electrical capacitors 10-1, 10-2, 10-3, respectively, at their respective ends, and these series combinations are connected to the output section and the inverting input section of the differential amplifier circuit. Desirably, a configuration is such that the other end of the source or the drain of each of the field effect transistors is connected to the inverting input section, and the other end of each of the electrical capacitors is connected to the output section of the differential amplifier circuit. Any one of the electrical capacitors 10-1, 10-2, 10-3 with which any one of gates 20-13, 20-23, 20-33 of the field effect transistors 20-1, 20-2, 20-3 has been applied a potential to bring the field effect transistor into conduction works effectively to store an electric charge or electric current from the photoelectric conversion cell and convert the electric charge or electric current into a voltage.

FIGS. 7-1 to 9-2 are circuit diagrams illustrating some examples of photoelectric conversion cells concerned with the present invention, and illustrate the examples in which a bipolar transistor is utilized to select a photoelectric conversion cell.

Figures 1, 7:
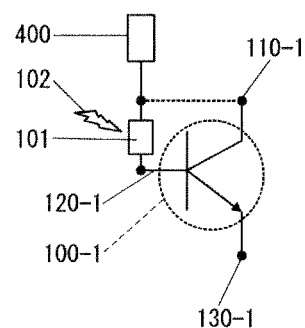
Figures 2, 7:
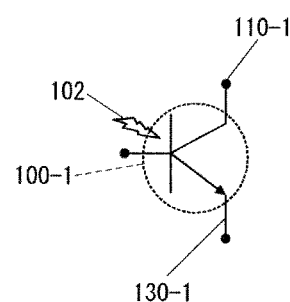

FIG. 7-1 illustrates a configuration in which one end of a photoelectric conversion element 101 (e.g. a photoresistor, a photodiode, a photocapacitor, or the like) is connected to a first base 120-1 of a first bipolar transistor 100-1, one of a first collector 110-1 and a first emitter 130-1 of the first bipolar transistor serves as the control section, the other serves as the output section, and either a required potential supply means 400 or the first collector 110-1 is connected to the other end of the photoelectric conversion element. Reference numeral 102 denotes a diagrammatic representation of light input.

FIG. 7-2 illustrates the circuit diagram under conditions where, when the photoelectric conversion element is the photodiode, the photoelectric conversion element shares a region with a diode formed of the first base, the first collector and a first base-collector junction of the first bipolar transistor, thereby to form a phototransistor, which is used as the photoelectric conversion cell.

Figures 1, 8:
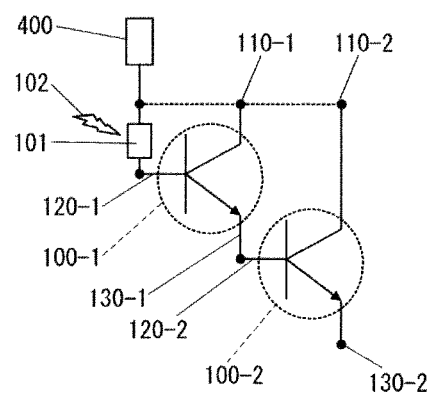
Figures 2, 8:
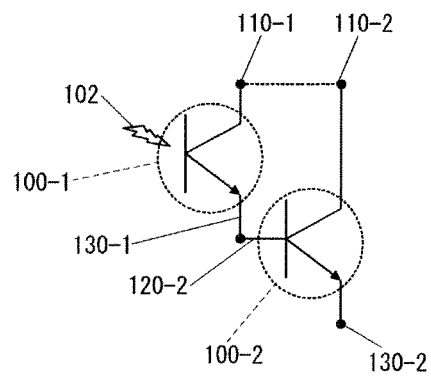

FIGS. 8-1 and 8-2 illustrate the circuit diagrams under conditions where the configurations illustrated in FIGS. 7-1 and 7-2 are further provided with a second bipolar transistor 100-2 including a second collector 110-2, a second base 120-2 and a second emitter 130-2, the first emitter 130-1 is connected to the second base 120-2, any one of the second emitter 130-2, the second collector 110-2 and the first collector 110-1 serves as the control section, and one of the others serves as the output section. FIG. 8-1 corresponds to the condition where the circuit illustrated in FIG. 7-1 is provided with the second bipolar transistor 100-2, and FIG. 8-2 corresponds to the condition where the circuit illustrated in FIG. 7-2 is provided with the second bipolar transistor 100-2.

Figures 1, 9:
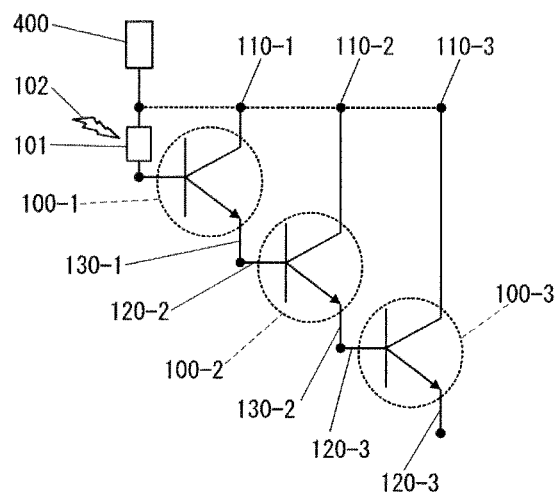
Figures 2, 9:
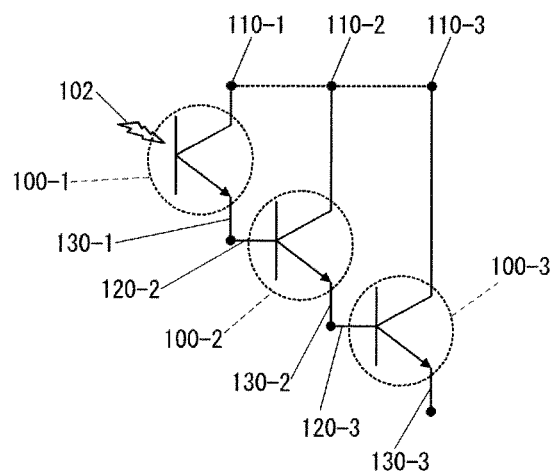

FIGS. 9-1 and 9-2 illustrate the circuit diagrams under conditions where the configurations illustrated in FIGS. 8-1 and 8-2 are further provided with a third bipolar transistor 100-3 including a third collector 110-3, a third base 120-3 and a third emitter 130-3, the second emitter 130-2 is connected to the third base 120-3, any one of the third emitter 130-3, the third collector 110-3, the second collector 110-2 and the first collector 110-1 serves as the control section, and one of the others serves as the output section. FIG. 9-1 corresponds to the condition where the circuit illustrated in FIG. 8-1 is provided with the third bipolar transistor 100-3, and FIG. 9-2 corresponds to the condition where the circuit illustrated in FIG. 8-2 is provided with the third bipolar transistor 100-3.

Figure 10:
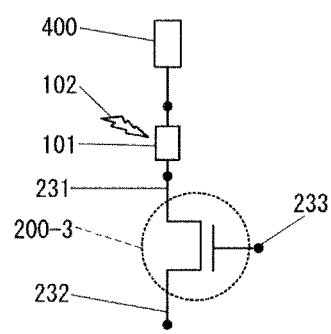
FIG. 10 is a circuit diagram illustrating First Example of a photoelectric conversion cell having an added switching function for on-off control of an electronic information output, using a field effect transistor.

FIG. 10 illustrates the photoelectric conversion cell configured so that one end of the photoelectric conversion element 101 is connected to one 231 of a third drain and a third source of a third field effect transistor 200-3 (or the above-described switching field effect transistor), a third gate 233 of the third field effect transistor serves as the control section, the other 232 of the third drain and the third source serves as the output section, and a required potential is connected to the other end of the photoelectric conversion element, in which the photoelectric conversion element is a photoresistor which changes in resistance by light irradiation, a photodiode which changes in voltage or current by light irradiation, a photocapacitor which changes in capacitance value by light irradiation, or the like.

Figures 1, 11:
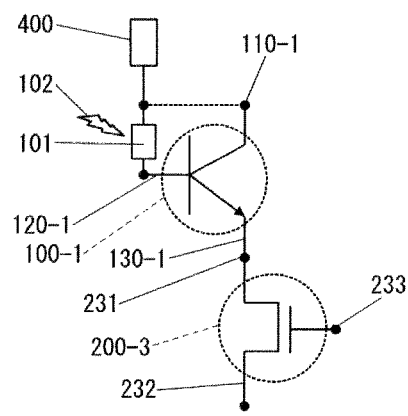
Figures 2, 11:
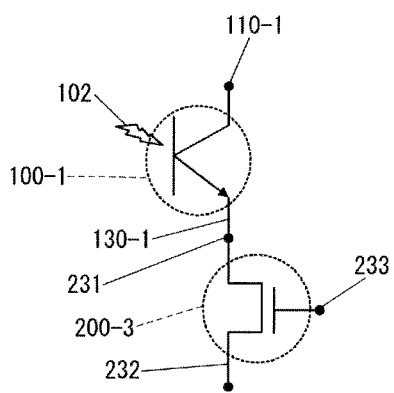

FIGS. 11-1 and 11-2 illustrate, in the circuits illustrated in FIGS. 7-1 and 7-2, the photoelectric conversion cell configured so that the first emitter 130-1 is connected to one 231 of the third drain and the third source of the third field effect transistor 200-3, the third gate 233 of the third field effect transistor serves as the control section, the other 232 of the third drain and the third source serves as the output section, and a required potential is connected to the other end of the photoelectric conversion element or the first collector. FIG. 11-1 corresponds to a condition where, in the circuit illustrated in FIG. 7-1, the first emitter 130-1 is connected to the one 231 of the third drain and the third source of the third field effect transistor, and FIG. 11-2 corresponds to a condition where, in the circuit illustrated in FIG. 7-2, the first emitter 130-1 is connected to the one 231 of the third drain and the third source of the third field effect transistor.

Figure 12:
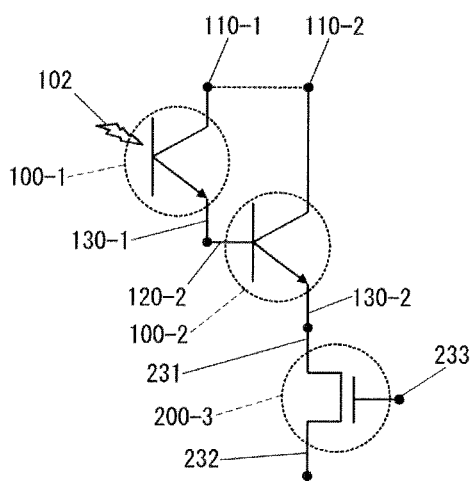
FIG. 12 is a circuit diagram illustrating a further Example of a photoelectric conversion cell having an added switching function for on-off control of an electronic information output, using a field effect transistor.

FIG. 12 illustrates, in the circuit illustrated in FIG. 8-2, the photoelectric conversion cell configured so that the second emitter is connected to one 231 of the third drain and the third source of the third field effect transistor 200-3, the third gate 233 of the third field effect transistor serves as the control section, the other 232 of the third drain and the third source serves as the output section, and a required potential is connected to either the first collector 110-1 or the second collector 110-2.

Figure 13:
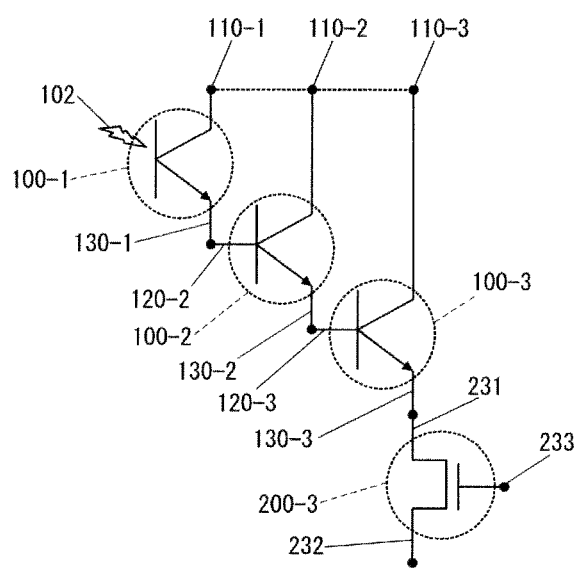
FIG. 13 is a circuit diagram illustrating a further Example of a photoelectric conversion cell having an added switching function for on-off control of an electronic information output, using a field effect transistor.

FIG. 13 illustrates, in the circuit illustrated in FIG. 9-2, the photoelectric conversion cell configured so that the third emitter 130-3 is connected to one 231 of the third drain and the third source of the third field effect transistor 200-3, the third gate 233 of the third field effect transistor serves as the control section, the other 232 of the third drain and the third source serves as the output section, and a required potential is connected to either the first collector 110-1, the second collector 110-2 or the third collector 110-3.

Description will be given with regard to a potential applied to the control section of the photoelectric conversion cell in order to output or cut off an electric charge or electric current from the output section of the photoelectric conversion cell for use in the present invention. Herein, a control section potential (sometimes called the output control potential) required to output an electric charge or electric current from the output section is referred to as the on-state potential, and a control section potential (sometimes called the output control potential) required to cut off an electric charge or electric current from the output section (although a current on the order of magnitude of leakage current flows) is referred to as the off-state potential.

For sake of simplicity of explanation, it is assumed that the bipolar transistors used in the photoelectric conversion cells illustrated in FIGS. 7-1 to 9-2 satisfy conditions given below.

1. An inverse current-amplification factor (which is a current-amplification factor when the collector is forward-biased for use as the emitter and the emitter is reverse-biased for use as the collector) is orders of magnitude smaller than a forward current-amplification factor.

2. The area of an emitterbase junction is smaller than the area of a collectorbase junction, and the amount of light applied to the emitterbase junction is smaller than the amount of light applied to the photoelectric conversion element (incidentally, a portion covered with an emitter metal electrode, even if irradiated with light, is not effective).

In this case, when the emitter junction is reverse-biased or when the collector junction is forward-biased, the output charge or current from the output section of the photoelectric conversion cell is cut off and is in the "off" state. As opposed to this, when the emitter junction is forward-biased or when the collector junction is reverse-biased, the output charge or current from the output section of the photoelectric conversion cell is obtained and is in the "on" state. Incidentally, when "an electric charge is outputted from the output section," a current obtained by dividing an electric charge Q by its output time t (an average value is Q/t) flows in a short time.

In the photoelectric conversion cells illustrated in FIGS. 7-1 to 9-2, when either the first emitter 130-1 (in the case of FIGS. 7-1 and 7-2), the second emitter 130-2 (in the case of FIGS. 8-1 and 8-2) or the third emitter 130-3 (in the case of FIGS. 9-1 and 9-2) serves as the control section, a potential such that the collector of the bipolar transistor having the emitter is reverse-biased at or above about 0.7 V is the off-state potential. (Incidentally; in the case of an npn transistor, a negative potential is applied to the collector potential, while in the case of a pnp transistor, a positive potential is applied to the collector potential; the same applies hereinbelow.) Meanwhile, a potential such that the collector is forward-biased is the on-state potential, and the output charge or current from the photoelectric conversion cell is obtained from the first, second or third collector and the emitter. (Incidentally, in the case of the npn transistor, a positive potential is applied to the collector potential, while in the case of the pnp transistor, a negative potential is applied to the collector potential; the same applies hereinbelow.) These potentials are typically fed from a pulse circuit which generates the potentials, through the selection line, to the emitter. Incidentally, when the off-state potential is supplied to the control section, a potential to reverse-bias the first emitter is selected as a potential supplied from the required potential supply means 400.

In the photoelectric conversion cells illustrated in FIGS. 7-1 to 9-2, when either the first collector 110-1 (in the case of FIGS. 7-1 and 7-2, 8-1 and 8-2, and 9-1 and 9-2), the second collector 110-2 (in the case of FIGS. 8-1 and 8-2, and 9-1 and 9-2) or the third collector 110-3 (in the case of FIGS. 9-1 and 9-2) serves as the control section, a potential such that the collector is reverse-biased at or above about 0.7 V for the first emitter 130-1 in the case of FIGS. 7-1 and 7-2, for the second emitter 130-2 in the case of FIGS. 8-1 and 8-2 or for the third emitter 130-3 in the case of FIGS. 9-1 and 9-2 is the off-state potential, and the output from the photoelectric conversion cells illustrated in FIGS. 7-1 to 9-2 is turned off. (Incidentally, when the bipolar transistor is the npn transistor, a negative potential is applied, while when the bipolar transistor is the pnp transistor, a positive potential is applied.) Meanwhile, a potential such that the collector is forward-biased is the on-state potential, and the output charge or current from the photoelectric conversion cell is obtained from the first, second or third collector and the first, second or third emitter selected as the output section of the photoelectric conversion cell. (Incidentally, when the bipolar transistor is the npn transistor, a positive potential is applied, while when the bipolar transistor is the pnp transistor, a negative potential is applied.)

As for the photoelectric conversion cells illustrated in FIGS. 10 to 13, the third field effect transistor serves as a switch for the photoelectric conversion cell, and thus, the bipolar transistor in the photoelectric conversion cell mainly serves an amplifying function. The other 232 of the source and the drain of the third field effect transistor serves as the output section, and the gate 233 thereof serves as the control section. Thus, the on-state potential, specifically, the potential to bring the third field effect transistor into conduction, which exceeds the potential of the output section 232 by a gate threshold voltage, is supplied to the gate, and thereby, the photoelectric conversion cell outputs an electric charge or electric current through the output section 232. Meanwhile, the potential which does not exceed the potential of the output section 232 by the gate threshold voltage is applied to the gate to make the third field effect transistor off, and thereby, the output charge or current from the photoelectric conversion cell is cut off from the output section 232.

The present invention can improve the sensitivity and sense speed of the photoelectric conversion array and is therefore available for the purpose of widening the field of applications of sensors, office equipment and scientific equipment utilizing photoelectric conversion. The present invention can be used as a high-sensitivity photoelectric conversion device or image pickup device to perform AD conversion and obtain optical signal information as a digital output, thus enlarging the range of utilization.

According to the method of operation and the circuit configuration according to (1) and (4) described above, the following effect is achieved.

A. During the third time period after the reading of a photoelectric conversion cell which has previously been selected before the selection of a now selected photoelectric conversion cell, the potential to bring the first field effect transistor into conduction is supplied to the first gate, and thus, the inverting input section of the differential amplifier circuit and the output line of the array connected to the inverting input section are driven at the reference potential from the output section of the differential amplifier circuit through the first field effect transistor (to the output section of the photoelectric conversion cell). Thereby, the previous record of reading is erased to thus make it possible to always read electronic information on the photoelectric conversion cell at the reference potential.

According to the method of operation and the circuit configuration according to (1) and (4) described above, the following effect is achieved.

B. Thereafter, the potential to make the first field effect transistor off is supplied to the first gate before the output control potential of the photoelectric conversion cell turns into the on-state potential. Then, the output control potential of the cell is changed into the on-state potential so that the output section of the photoelectric conversion cell supplies the electric current or electric charge to the inverting input section. Thereby, since the first field effect transistor is cut off, the electric current or electric charge from the output section starts charging the electrical capacitor Cc (here, the electrical capacitance value also is indicated by Cc), and the integral charge Qi of the current which has flowed into the electrical capacitor until the supplied electric charge Q0 and the output control potential of the photoelectric conversion cell are changed from the on-state potential to the off-state potential (i.e. during the first time period) is stored in the electrical capacitor. The output potential of the differential amplifier circuit stays substantially at Vref+(Q0+Qi)/Cc after the output control potential of the photoelectric conversion cell has been changed into the off-state potential.

C. During a time period (i.e. the second time period) over which the output potential of the differential amplifier circuit is substantially in a settled state, the output potential is little affected by the influence of noise, or feed-through noise, caused by a pulse to supply the on-state potential or the off-state potential to the control section of the photoelectric conversion cell. Although feed-through noise Vno caused by a pulse to apply the on-state potential and feed-through noise Vnf caused by a pulse to apply the off-state potential appear in the output as illustrated in FIG. 6, the noises are of approximately equal magnitude and are of opposite sign, and therefore, after all, the influence of the feed-through noise upon the output potential of the differential amplifier circuit becomes lessened after the application of the pulse to change the output control potential into the off-state potential to the control section of the photoelectric conversion cell.

D. As described in (11), during the second time period after the output control potential of the photoelectric conversion cell has been changed into the off-state potential, the outputs from the sense circuits connected to many output lines of the photoelectric conversion array are sequentially sampled and scanned by utilizing the time period over which the output potential of the differential amplifier circuit is substantially in the settled state, in the case of (1) and (4) (or the time period while the output potential of the differential amplifier circuit is changing gradually, in the case of (7)). Thereby, electronic information in the direction intersecting the columns of the output lines of the photoelectric conversion array can be obtained as time-series signals.

E. As described in (10) and (12), by utilizing the time period over which the output potential of the differential amplifier circuit is substantially in the settled state after the output control potential of the photoelectric conversion cell has been changed into the off-state potential, the outputs from the sense circuits connected to many output lines of the photoelectric conversion array are subjected to AD conversion by the AD converter circuits, and the outputs obtained by the AD conversion are sequentially sampled and scanned. Thereby, electronic information in the direction intersecting the columns of the output lines of the photoelectric conversion array can be obtained as time-series signals.

According to (2) and (5) described above, the following effect is achieved.

F. After the output potential of the differential amplifier circuit has been substantially settled (or after the second time period), during the third time period, the potential to bring the first field effect transistor into conduction is supplied again to the first gate, and the output control potential of the same photoelectric conversion cell is changed into the on-state potential. Thereby, electric charge stored in the photoelectric conversion cell which has been incompletely read is drawn, and thus, at the next reading time, electronic information errors caused by remaining charge can be reduced. Also, the time period during which the first field effect transistor is brought into conduction is provided after the output control potential of the same photoelectric conversion cell has been changed into the off-state potential. Thereby, the potential of read lines can be reset to the reference potential, and thus, at the time of reading of the next photoelectric conversion cell, the previous record of a read potential is canceled for any photoelectric conversion cell.

Before electronic information is read from the photoelectric conversion cell (or before the output control potential of the photoelectric conversion cell turns into the on-state potential), the output section of the photoelectric conversion cell or the output line of the photoelectric conversion array supplies the on-state potential to bring the first field effect transistor into conduction to the first gate thereby to set the potential to the reference potential. Therefore, at the time of reading of the electronic information, the reading starts at the reference potential Vref.

G. The amount of potential change $\Delta V1$ in the output section of the photoelectric conversion cell or the output line of the photoelectric conversion array, in the process of reading, is $(Q0+Qi)/Cc/A$ even at the time when the output of the differential amplifier circuit reaches the above-described value $Vref+(Q0+Qi)/Cc$. Here, A denotes the amplification factor of the differential amplifier circuit, and an amplification factor equal to or more than 1000 is feasible even with a simple circuit. Therefore, when the output of the differential amplifier circuit operates on the order of a few volts, the amount of potential change $\Delta V1$ is a few millivolts. Thus, the influence of stray capacitances of the output line upon a read speed is $1/1000$ of that in a sense circuit in which a resistor is used for conversion into voltage, in either of a CMOS photoelectric conversion array for a voltage output and a photoelectric conversion array for a current output (generally, the influence is $1/A$). Losses of read information from the photoelectric conversion cell, which remains in the output line, also are significantly reduced.

When the sense circuit uses a current or voltage amplifying function, variations in the amplification factor lead directly to variations in the output voltage or current from the sense circuit. However, in the case of the sense circuit to which the method of operation of the present invention is applied, the output from the sense circuit varies little and becomes nearly equal to $Vref+(Q0+Qi)/Cc$ even if the amplification factor varies, provided that the amplification factor is to a certain or greater extent of magnitude.

H. As a result of this, the sense circuit has high tolerance for variations in element parameters which form the sense circuit, and thus, the circuit is configurable with a small number of elements and hence in simple circuit configuration. This means that a corresponding number of sense amplifier arrays to the number of output lines can be implemented in a small occupied area.

Therefore, the following effects are achieved.

I. According to the method of operation (2) and the sense circuit (5), stored charge remaining in the photoelectric conversion cell because of an insufficient amount of read time can be released.

J. According to the method of operation (3) and the sense circuit (6), when the potential to make the first field effect transistor off is supplied to the first gate, disturbance in the output line caused by a feed-through current through a gate-source or gate-drain parasitic capacitance of the first field effect transistor, which results in a slight deviation of the output line from the reference potential, is reduced.

Although the preferred embodiments of the present invention have been described, it should be understood that the present invention is not limited to the embodiments, various modifications and changes can be made to the embodiments by those skilled in the art as long as such modifications and changes are within the scope of the present invention as defined by the Claims.

What is claimed is:

1. A method of operation of a sense circuit configured to be connected to a photoelectric conversion cell amongst a plurality of photoelectric conversion cells in a photoelectric conversion array, each cell amongst the plurality of photoelectric conversion cells having its own output section to output an electric current or electric charge, the sense circuit comprising:

a differential amplifier circuit including an inverting input section, a non-inverting input section, and an output section;

an electrical capacitor connected between the inverting input section and the output section; and a first field effect transistor including a first source, a first drain, and a first gate, wherein one of the first source and the first drain is connected to the inverting input section, and the other of the first source and the first drain is connected to the output section, wherein a reference potential is supplied to the non-inverting input section, an output section of the photoelectric conversion cell to output an electric current or electric charge, with an output line of the photoelectric conversion array connected with the output section of the photoelectric conversion cell, is directly connected to the inverting input section, the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs electronic information as the electric current or electric charge, before the output control potential of the photoelectric conversion cell turns into the on-state potential, a potential to make the first field effect transistor off is supplied to the first gate, the output control potential of the photoelectric conversion cell is changed into the on-state potential, and thereby, during a first time period, the output section of the photoelectric conversion cell supplies the electric current or electric charge to the inverting input section, during a second time period, the output control potential of the photoelectric conversion cell is held at the off-state potential thereby to hold a potential (or voltage) of the output section of the differential amplifier circuit, and thereafter, during a third time period, a potential to bring the first field effect transistor into conduction is supplied to the first gate, and after that, the potential to make the first field effect transistor off is supplied to the first gate.

2. The method of operation of the sense circuit, according to claim 1, wherein after the output control potential of the same photoelectric conversion cell has been changed into the on-state potential within the third time period, the output control potential is changed into the off-state potential.

3. A method of operation of a sense circuit, the sense circuit comprising:

a differential amplifier circuit including an inverting input section, a non-inverting input section, and an output section;

an electrical capacitor connected between the inverting input section and the output section; and a first field effect transistor including a first source, a first drain, and a first gate, wherein one of the first source and the first drain is connected to the inverting input section, and the other of the first source and the first drain is connected to the output section, wherein a reference potential is supplied to the non-inverting input section, an output section of the photoelectric conversion cell to output an electric current or electric charge is connected to an output line of a photoelectric conversion array which is connected to the inverting input section, the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs electronic information as the electric current or electric charge, before the output control potential of the photoelectric conversion cell turns into the on-state potential, a potential to make the first field effect transistor off is supplied to the first gate, the output control potential of the photoelectric conversion cell is changed into the on-state potential, and thereby, during a first time period, the output section of the photoelectric conversion cell supplies the electric current or electric charge to the inverting input section, during a second time period, the output control potential of the photoelectric conversion cell is held at the off-state potential thereby to hold a potential (or voltage) of the output section of the differential amplifier circuit, and thereafter, during a third time period, a potential to bring the first field effect transistor into conduction is supplied to the first gate, and after that, the potential to make the first field effect transistor off is supplied to the first gate, wherein the sense circuit further comprises a second field effect transistor including a second source, a second drain, and a second gate, the one of the first source and the first drain of the first field effect transistor is disconnected from the inverting input section and is connected to one of the second source and the second drain of the second field effect transistor, the other of the second source and the second drain is connected to the inverting input section, and a potential to bring the second field effect transistor into conduction is supplied to the second gate of the second field effect transistor.

4. A sense circuit configured to be connected to a photoelectric conversion cell amongst a plurality of photoelectric conversion cells in a photoelectric conversions array, each cell amongst the plurality of photoelectric conversion cells having its own output section to output an electric current or electric charge, the sense circuit comprising:

a differential amplifier circuit including an inverting input section, a non-inverting input section, and an output section;

an electrical capacitor connected between the inverting input section and the output section; and a first field effect transistor including a first source, a first drain, and a first gate, wherein one of the first source and the first drain is connected to the inverting input section, and the other of the first source and the first drain is connected to the output section, a reference potential is supplied to the non-inverting input section, an output section of the photoelectric conversion cell to output an electric current or electric charge, with an output line of the photoelectric conversion array connected with the output section of the photoelectric conversion cell, is directly connected to the inverting input section, the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs the electric current or electric charge, before the output control potential of the photoelectric conversion cell turns into the on-state potential, a potential to make the first field effect transistor off is supplied to the first gate, the output control potential of the photoelectric conversion cell is changed into the on-state potential, and thereby, during a first time period, the output section of the photoelectric conversion cell supplies the electric current or electric charge to the inverting input section, the output control potential of the photoelectric conversion cell is held at the off-state potential during a second time period thereby to hold a potential (or voltage) of the output section of the differential amplifier circuit for a required time, and thereafter, during a third time period, a potential to bring the first field effect transistor into conduction is supplied to the first gate, and after that, the potential to make the first field effect transistor off is supplied to the first gate.

5. The sense circuit according to claim 4, wherein after the output control potential of the same photoelectric conversion cell has been changed into the on-state potential within the third time period, the output control potential is changed into the off-state potential.

6. A photoelectric conversion array comprising:
a plurality of photoelectric conversion cells each including an output section and a control section;
a plurality of output lines extending in a first direction; and
a plurality of sense circuits according to claim 4,
wherein one or more of the plurality of photoelectric conversion cells arranged in the first direction is connected at the output section to one of the plurality of output lines, and one of the plurality of sense circuits is connected at the inverting input section to the one output line.

7. The photoelectric conversion array according to claim 6, further comprising:
a plurality of selection lines extending in a second direction intersecting the first direction; and
a selection line driver circuit to drive the selection lines,
wherein one or more of the plurality of photoelectric conversion cells arranged in the second direction is connected at an output control section to one of the plurality of selection lines, and the selection line driver circuit sequentially supplies the off-state potential of the output control potential of the photoelectric conversion cell, the on-state potential thereof, and, further, the off-state potential thereof, to the plurality of selection lines.

8. The photoelectric conversion array according to claim 7, further comprising:
a plurality of AD (analog-to-digital) converter circuits each including an input section connected to a corresponding one of the output sections of the plurality of sense circuits,
wherein during a time period while the selection line driver circuit is supplying the off-state potential to the selection lines, the output potential of the plurality of sense circuits is captured and subjected to AD conversion.

9. The photoelectric conversion array according to claim 7, further comprising:
a plurality of scan circuits each including an input section connected to a corresponding one of the output sections of the plurality of sense circuits,
wherein during the time period while the selection line driver circuit is supplying the off-state potential to the selection lines, the output potential of the plurality of sense circuits is captured and scanned.

10. The photoelectric conversion array according to claim 8, wherein the plurality of AD converter circuits each further include an output section to output a digital signal obtained by the AD conversion, and a plurality of scan circuits each including an input section connected to a corresponding one of the output sections of the plurality of AD converter circuits are provided to capture and scan the digital outputs from the plurality of AD converter circuits during the time period while the selection line driver circuit is supplying the off-state potential to the selection lines.

11. The photoelectric conversion array according to claim 6, wherein the plurality of photoelectric conversion cells each including the output section and the control section are each configured so that one end of a photoelectric conversion element is connected to one of a third drain and a third source of a third field effect transistor, a third gate of the third field effect transistor serves as the control section, the other of the third drain and the third source serves as the output section, and a specified potential is connected to the other end of the photoelectric conversion element, and the photoelectric conversion element is any one of a photoresistor which changes in resistance by light irradiation, a photodiode which changes in voltage or current by light irradiation, and a photocapacitor which changes in capacitance value by light irradiation.

12. A sense circuit configured to be connected to a photoelectric conversion cell amongst a plurality of photoelectric conversion cells in a photoelectric conversions array, each cell amongst the plurality of photoelectric conversion cells having its own output section to output an electric current or electric charge, the sense circuit comprising:
a differential amplifier circuit including an inverting input section, a non-inverting input section, and an output section;
an electrical capacitor connected between the inverting input section and the output section; and
a first field effect transistor including a first source, a first drain, and a first gate,
wherein one of the first source and the first drain is connected to the inverting input section, and the other of the first source and the first drain is connected to the output section,
a reference potential is supplied to the non-inverting input section,
an output section of the photoelectric conversion cell to output an electric current or electric charge, with an output line of the photoelectric conversion array connected with the output section of the photoelectric conversion cell, is directly connected to the inverting input section,
the photoelectric conversion cell is configured so that, when an output control potential supplied to a control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs the electric current or electric charge, before the output control potential of the photoelectric conversion cell turns into the on-state potential, a potential to make the first field effect transistor off is supplied to the first gate, the output control potential of the photoelectric conversion cell is changed into the on-state potential, and thereby, during a first time period, the output section of the photoelectric conversion cell supplies the electric current or electric charge to the inverting input section, the output control potential of the photoelectric conversion cell is held at the off-state potential during a second time period thereby to hold a potential (or voltage) of the output section of the differential amplifier circuit for a required time, and thereafter, during a third time period, a potential to bring the first field effect transistor into conduction is supplied to the first gate, and after that, the potential to make the first field effect transistor off is supplied to the first gate, the sense circuit further comprising a second field effect transistor including a second source, a second drain, and a second gate, wherein the one of the first source and the first drain of the first field effect transistor is disconnected from the inverting input section and is connected to one of the second source and the second drain of the second field effect transistor, the other of the second source and the second drain is connected to the inverting input section, and a potential to bring the second field effect transistor into conduction is supplied to the second gate of the second field effect transistor.

13. A photoelectric conversion array, comprising:
a plurality of photoelectric conversion cells each including an output section and a control section;
a plurality of output lines extending in a first direction; and
a plurality of sense circuits,
wherein one or more of the plurality of photoelectric conversion cells arranged in the first direction is connected at the output section to one of the plurality of output lines,
the plurality of photoelectric conversion cells each including the output section and the control section are further each configured so that one end of a photoelectric conversion element is connected to a first base of a first bipolar transistor, one of a first collector and a first emitter of the first bipolar transistor serves as the control section, the other serves as the output section, and either a required potential supply means or the first collector is connected to the other end of the photoelectric conversion element, and the photoelectric conversion element is any one of a photoresistor which changes in resistance by light irradiation, a photodiode which changes in voltage or current by light irradiation, and a photocapacitor which changes in capacitance value by light irradiation,
each sense circuit amongst the plurality of sense circuits having been configured to be connected to a photoelectric conversion cell amongst the plurality of photoelectric conversion cells in the photoelectric conversions array, each cell amongst the plurality of photoelectric conversion cells having the output section to output an electric current or electric charge,
said sense circuit comprising:
a differential amplifier circuit including an inverting input section, a non-inverting input section, and an output section;
an electrical capacitor connected between the inverting input section and the output section; and
a first field effect transistor including a first source, a first drain, and a first gate,
wherein one of the first source and the first drain is connected to the inverting input section, and the other of the first source and the first drain is connected to the output section,
a reference potential is supplied to the non-inverting input section,
the output section of the photoelectric conversion cell to output an electric current or electric charge, with the one of the plurality of output line of the photoelectric conversion array connected with the output section of the photoelectric conversion cell, is directly connected to the inverting input section,
the photoelectric conversion cell is configured so that, when an output control potential supplied to the control section of the photoelectric conversion cell is an off-state potential, the output section of the photoelectric conversion cell does not output significant electronic information (although it produces an output on the order of magnitude of leakage current), and so that, when the output control potential changes into an on-state potential, the output section outputs the electric current or electric charge, before the output control potential of the photoelectric conversion cell turns into the on-state potential, a potential to make the first field effect transistor off is supplied to the first gate,
the output control potential of the photoelectric conversion cell is changed into the on-state potential, and thereby, during a first time period, the output section of the photoelectric conversion cell supplies the electric current or electric charge to the inverting input section,
the output control potential of the photoelectric conversion cell is held at the off-state potential during a second time period thereby to hold a potential (or voltage) of the output section of the differential amplifier circuit for a required time, and
thereafter, during a third time period, a potential to bring the first field effect transistor into conduction is supplied to the first gate, and after that, the potential to make the first field effect transistor off is supplied to the first gate.

14. The photoelectric conversion array according to claim 13, wherein the photoelectric conversion cell is configured so that the photoelectric conversion element is formed of the first base, the first collector and a first base-collector junction of the first bipolar transistor.

15. The photoelectric conversion array according to claim 13, wherein the photoelectric conversion cell is further provided with a second bipolar transistor including a second collector, a second base and a second emitter, the first emitter is connected to the second base, any one of the second emitter, the second collector and the first collector serves as the control section, and one of the others serves as the output section.

16. The photoelectric conversion array according to claim 14, wherein the photoelectric conversion cell is further provided with a second bipolar transistor including a second collector, a second base and a second emitter, the first emitter is connected to the second base, any one of the second emitter, the second collector and the first collector serves as the control section, and one of the others serves as the output section.

17. The photoelectric conversion array according to claim 15, wherein the photoelectric conversion cell is further provided with a third bipolar transistor including a third collector, a third base and a third emitter, the second emitter is connected to the third base, any one of the third emitter, the third collector, the first collector and the second collector serves as the control section, and one of the others serves as the output section.

18. The photoelectric conversion array according to claim 16, wherein the photoelectric conversion cell is further provided with a third bipolar transistor including a third collector, a third base and a third emitter, the second emitter is connected to the third base, any one of the third emitter, the third collector, the first collector and the second collector serves as the control section, and one of the others serves as the output section.

19. The photoelectric conversion array according to claim 13, wherein the photoelectric conversion cell is configured so that the first emitter of the photoelectric conversion cell is connected to a third drain and a third source of a third field effect transistor, a third gate of the third field effect transistor serves as the control section, the other of the third drain and the third source serves as the output section, and a specified potential is connected to the first collector.

20. The photoelectric conversion array according to claim 15, wherein the photoelectric conversion cell is configured so that the second emitter of the photoelectric conversion cell is connected to a third drain and a third source of a third field effect transistor, a third gate of the third field effect transistor serves as the control section, the other of the third drain and the third source serves as the output section, and a specified potential is connected to either the first collector or the second collector.

21. The photoelectric conversion array according to claim 17, wherein the photoelectric conversion cell is configured so that the third emitter of the photoelectric conversion cell is connected to a third drain and a third source of a third field effect transistor, a third gate of the third field effect transistor serves as the control section, the other of the third drain and the third source serves as the output section, and a specified potential is connected to either the first collector, the second collector or the third collector.

* * * * *